United States Patent [19]

Fletcher et al.

[11] 4,053,918
[45] Oct. 11, 1977

[54] HIGH VOLTAGE, HIGH CURRENT SCHOTTKY BARRIER SOLAR CELL

[76] Inventors: James C. Fletcher, Administrator of the National Aeronautics and Space Administration, with respect to an invention of; Richard J. Stirn, La Canada, Calif.

[21] Appl. No.: 495,021

[22] Filed: Aug. 5, 1974

[51] Int. Cl.² .................... H01L 27/14; H01L 31/00; H01L 29/48; H01L 29/205
[52] U.S. Cl. ........................................ 357/30; 357/15; 357/16; 136/89 SJ
[58] Field of Search ................ 357/15, 16, 30; 136/89

[56] References Cited
U.S. PATENT DOCUMENTS

| | | | |
|---|---|---|---|
| 3,049,622 | 8/1962 | Ahlstrom et al. | 357/30 |
| 3,322,575 | 5/1967 | Ruehrwein | 357/16 |
| 3,508,126 | 4/1970 | Newman et al. | 357/16 |
| 3,757,123 | 9/1973 | Archer et al. | 357/15 |

OTHER PUBLICATIONS

H. Hovel et al "High-Efficiency GaI-x AlxAs P-N Junction Solar Cells" IBM Tech. Disclosure Bulletin vol. 15, (5/73) p. 3741.
H. Hovel et al "Solar Cell Structures" IBM Technical Disclosure Bulletin vol. 16, (12/73) pp. 2079-2080.
H. Hovel et al "The Spectrl Response . . . GAl-x-Alx-- GaAs Solar Cells" *Gallium Arsenide and Related Compounds* Proc. 4th Int. Symposium (9/72) pp. 205-213 Publ. Institute of Physics, London 1973.

*Primary Examiner*—William D. Larkins
*Assistant Examiner*—Gene M. Munson
*Attorney, Agent, or Firm*—Monte F. Mott; Paul F. McCaul; John R. Manning

[57] ABSTRACT

A Schottky barrier solar cell is disclosed, consisting of a layer of wide band gap semiconductor material such as AlGaAs on which a very thin film of semi-transparent metal is deposited to form a Schottky barrier. The layer of the wide band gap semiconductor material is on top of a layer of narrower band gap semiconductor material, to which one of the cell's contacts may be attached directly or through a substrate. The cell's other contact is a grid structure which is deposited on the thin metal film.

8 Claims, 2 Drawing Figures

HIGH VOLTAGE, HIGH CURRENT SCHOTTKY BARRIER SOLAR CELL

ORIGIN OF INVENTION

The invention described herein was made in the performance of work under a NASA contract and is subject to the provisions of Section 305 of the National Aeronautics and Space Act of 1958, Public Law, 85—568 (72 Stat. 435; 42 USC 2457).

BACKGROUND OF THE INVENTION

1. Field of the Invention

The present invention generally relates to an energy converter, and more particularly, to a new solar cell for converting solar light to electrical energy.

2. Description of the Prior Art

The problems associated with the development of efficient converters of sunlight (solar light) to electrical energy are well known. Although extensive research and development is conducted in this field, at very great expenditure, all known sunlight converters, generally referred to as solar cells, are relatively inefficient. Most of the known solar cells are of the photovoltaic $p/n$ junction type. Such a cell includes a first layer of semiconductor material doped to one polarity, e.g., $n$, and a second counter-doped ($p$) semi-conductor layer, which together from the $p/n$ junction. Most of the experience which has been gained in the development and fabrication of such cells, particularly in connection with space exploration, is with silicon (Si) as the doped semi-conductor material.

As is appreciated, sunlight includes energy in a spectrum of wavelengths rather than at one specific wavelength. Sunlight includes more photons of lower energy (longer wavelength) than photons of higher energy (shorter wavelength). The sunlight spectrum is such that the optimum band gap in electron volts (eV) is around 1.5eV. The band gap of silicon in terms of electron volts (eV) is about 1.1eV. Also, due to the limited band gap of Si, the output voltage of a silicon solar cell is low. It is generally on the order of half the silicon band gap, i.e., 0.6eV. These factors, among others, are the reasons why silicon solar cells are inefficient in converting solar light to electrical energy. The conversion efficiency of conventional $p/n$ junction-type silicon cells is in the order of 11% of the incident energy at room temperature for space equivalent sunlight.

To increase the conversion efficiency, research is being conducted to develop a $p/n$ junction-type cell in which gallium arsenide (GaAs) rather than Si is used. As is known, GaAs has a band gap of about 1.4eV which is closer to the optimum band gap for sunlight. Thus, the output voltage is expected to be higher than that with a silicon solar cell, due to the higher band bending taking place. However, despite the theoretical advantages of a $p/n$ junction type GaAs cell, there are several problems which must first be solved before a more efficient cell can be produced.

With present day material technology, good quality GaAs of any of its ternary compounds can be produced. However, such materials are compound materials which tend to disassociate at the high temperatures, which are required for diffusing or annealing ion-implanted $p/n$ junctions. Such disassociation of the material can adversely affect its diffusion length, which in turn would reduce the number of generated carriers contributing to the desired current. Thus, before GaAs (or its ternary compounds) can be used to fabricate a satifactory $p/n$ junction type converter, advances in material technology must take place.

Also, even if such a cell where realizable at present, it would have several significant disadvantages. In a $p/n$ junction type cell the top counter-doped layer is relatively thick, i.e., several thousand Angstrom units. Such a layer, made of doped wide band gap material would tend to absorb a significant amount of the sunlight, particularly the short wavelength of 0.8 microns and less. Also, at the top surface of the top counter-doped layer, the surface will provide recombination centers for the holes and electrons generated in the near surface region, thereby further reducing the carriers which would contribute to the generated current. It should thus be appreciated that even if the fabrication of $p/n$ junction type cells with GaAs or any other semiconductor material of wider band gap (then silicon) were possible with present day technology, such a cell may produce limited current due to the discussed problems.

OBJECTS AND SUMMARY OF THE INVENTION

It is a primary object of the present invention to provide a new improved solar cell.

Another object of the present invention is to provide a relatively efficient cell for converting solar light which does not employ a $p/n$ junction.

A further object of the present invention is to provide a new cell particularly adapted for converting solar light into electrical energy at relatively high efficiency.

A further object of the invention is to provide a relatively high voltage high current solar cell, which is fabricatable with presently known techniques.

These and other objects of the invention are achieved by providing a multilayered cell which includes a first layer of semiconductor material of a relatively wide band gap and a thin film of semitransparent metal, which is deposited on the top surface of the first layer and which together therewith forms a Schottky barrier cell. Extending from the first layer of the wide band gap semiconductor material, remote from the thin metal film, is a second layer of a lower band gap semiconductor material. The wide band gap of the first layer contributes to higher output voltage. Also, the first layer of the wide band gap material is particularly efficient in converting the energy of high energy photons (those with energies higher than the band gap) in the solar light into the desired current. Photons of energies less than the band gap width of the first layer pass through the first layer and are absorbed in the second layer of the narrower band gap. The carriers which are generated therein move to the Schottky barrier through the first layer and thereby further contribute to the generated current.

The novel features of the invention are set forth with particularity in the appended claims. The invention will best be understood from the following description when read in conjunction with the accompanying drawings.

DESCRIPTION OF THE PREFERRED EMBODIMENTS

Figure 1:
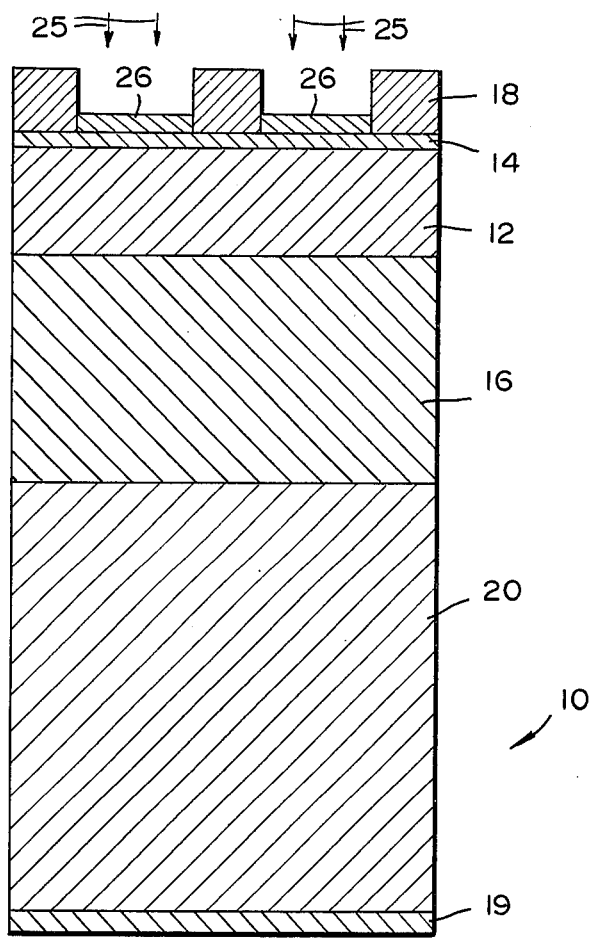
FIG. 1 is a cross sectional diagram of one embodiment of the novel solar cell of the present invention.

Attention is first directed to FIG. 1 which is a cross sectional view of one embodiment of the novel solar cell of the present invention, which is generally designated by numeral 10. It consists of a layer 12 of a doped wide band gap semiconductor material, such as for example $Al_xGa_{1-x}As$. When $x \simeq 0.8$ layer 12 has a band gap of about 2.1eV. As will be pointed out hereinafter the thickness of layer 12 is preferably of the order of 1 micron or less. Deposited on top of the wide band gap layer is a thin layer 14 of semi-transparent metal, hereinafter simply referred to as the metal film 14. It is very thin, on the order of 100° A or less. It together with the wide band gap layer 12 form a Schottky barrier.

The wide band gap layer 12 is on top of a layer 16 of a doped narrower band gap material such as GaAs. One of the contacts of the cell is a grid structure 18 which is deposited on the top of the metal film 14. The other contact 19 may be deposited on the bottom side of layer 16. Preferably the contact 19 is attached to a layer 20 of a highly doped semiconductor material, such as GaAs, which serves as the substrate for the narrow band gap layer 16. Layer 20, which may be on the order of several mils thick, serves to support the thinner layers about it, as well as to minimize series resistance. Also, it is easier to attach contact 19 to the heavier doped layer 20 than to the less doped layer 16. Layer 20 does not contribute to the current generation and therefore it will not be discussed hereinafter in any detail.

In FIG. 1, arrows 25 represent the solar light which is directed to the cell 10. If desired the exposed top surface of metal film 14, which is not covered by grid structure 18, may be coated by an antireflection coating 26.

As previously stated, metal film 14 is very thin, generally on the order of tens of Angstroms. Due to its semi-transparency and the fact that it is very thin, very little of the solar light is absorbed in it. Alternately stated, most of the photons pass through the metal film 14 and penetrate the wide band gap layer 12.

The advantages of the novel cell which can be thought of as a Schottky barrier (SB) solar cell may best be highlighted with a specific example. Let it be assumed that the band gap width of layer 12 is about 2.1eV. With such a layer the expected output voltage is relatively high, on the order of 1 volt. This is one significant advantage of SB solar cells, which is realized by the incorporation of the wide band gap layer 12. Also, those photons of the solar light with energies above 2.1eV which penetrate layer 12 are absorbed therein and generate carriers. Although the number of such photons in solar light is not great (about 1/6th of the total number of photons in sunlight), the energies of those that are present are more efficiently converted to generate carriers rather than be dissipated as heat, since the band gap width is closer to the energies of the higher energy photons.

It is known that in wide band gap semiconductor material, those photons which are absorbed therein do not penetrate very deeply into the material. That is, they are absorbed closely to the material's top surface. In the particular example, most of the high energy photons (above 2.1eV) are absorbed within 1 micron or less from the top surface of layer 12, i.e., very close to the thin film 14. Layer 12 should be made very thin on the order of 1 micron or less, e.g., a few thousand A. This is so that the carriers generated in the second layer 16, as discussed, hereinafter, will be more readily collected at the metal film to make up the current output. Due to the presence of the metal film 14 an electric field is present in what is referred to by those familiar with the art as the space charge region. As a result, most of the carriers generated in layer 12 drift to the barrier and thereby efficiently contribute to the generated current.

However, the total current generated from the photons absorbed in layer 12 is not high, since the number of high energy photons in the solar light is relatively small. It is for this reason that layer 16 is included. As previously pointed out its band gap is narrower than that of layer 12. In the example, layer 16 is assumed to be GaAs. Thus, it has a band gap of about 1.4eV. In the present example, all photons with energies below 2.1eV pass through the layer 12 and penetrate the lower layer 16 as do some of the photons with energy greater than 2.1eV depending on the thickness of layer 12. Therein, these photons are absorbed and generate carriers. In layer 16, these photons are absorbed close to its top surface and therefore it can be made relatively thin, e.g., several microns.

The layers 16 and 12 are grown so as not to form a barrier between them. Thus, the minority carriers generated in layer 16 move through layer 12 to the Schottky barrier. It is possible that since layer 12 is very thin the space charge region may extend to layer 16. If so, many of the carriers generated therein would drift (rather than move by diffusion) to the barrier under the influence of the electric field. This would enhance the generated current. In any case, many of the carriers generated in layer 16 will pass through layer 12 and reach the barrier, thereby contributing to the generated current. Significantly higher power output is expected from the SB solar cell of the present invention, since by incorporating layers 12 and 16 the energies of most of the photons with energies above 1.4eV are efficiently converted to generate the output current at higher voltages than would otherwise be possible in a single layer SB solar cell.

It should be stressed that the cell of the present invention is manufacturable with presently known techniques. It does not require the development of new material technology which is the case if wide band-gap materials are to be employed in a *p/n* junction-type cell. For the specific examples of layers 12, 16 and 20, used hereinbefore to explain the invention, the highly doped GaAs layer 20 is first grown. Then the layers 16 and 12 are sequentially grown epitaxially thereon. The narrower band gap layer 16 is on the order of several microns thick while the band gap layer 12 is much thinner, on the order of one micron or less.

Once the three layers are produced all additional manufacturing steps are performable at room temperatures so as not to affect the properties of the layers 12 and 16. For example, the deposition of the thin film 14 as well as the contacts 18 and 19 and the coating 26 may be performed at room temperature with known techniques.

This point is very significant. Most wide band gap semiconductor materials or simply semiconductors are compound semiconductors. They tend to disassociate at high temperatures and thereby adversely affect their properties such as diffusion length. Thus, in order to effectively utilize such wide band gap semiconductors once they are grown, it is very desirable that subsequent fabrication steps be conducted at relatively low temperatures. This is possible when fabricating the novel cell of the present invention. On the other hand, with present known techniques, relatively high temperatures are required to diffuse the materials needed to form a p/n junction.

Figure 2:
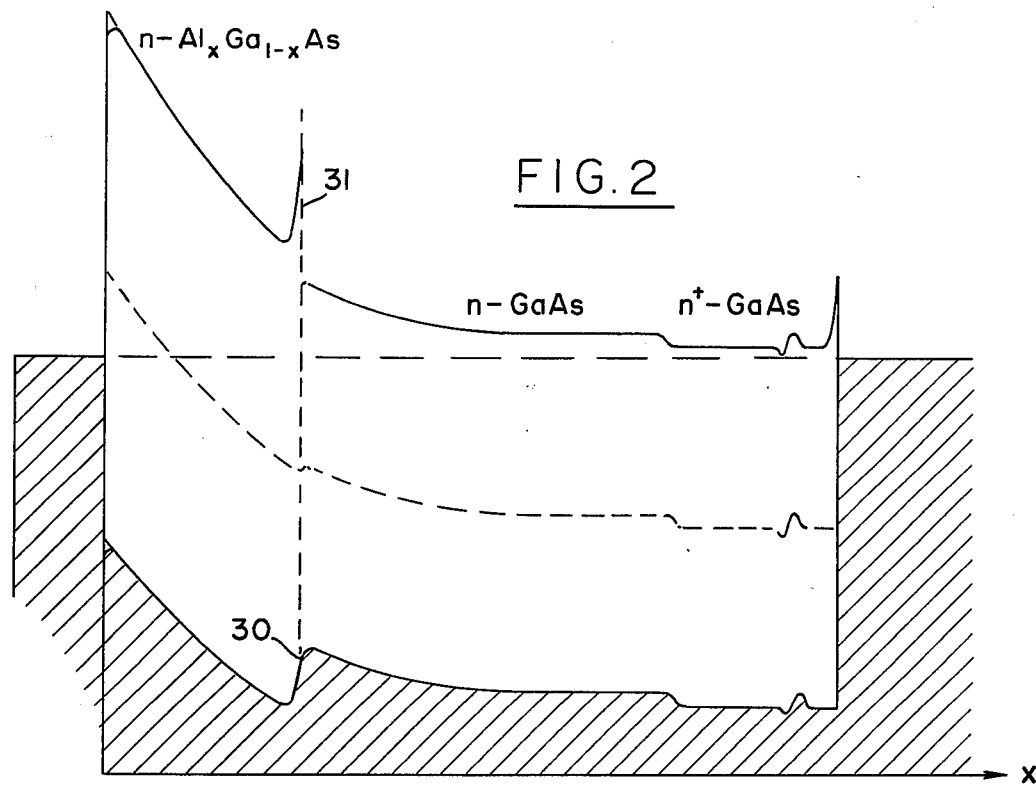
FIG. 2 is a band gap diagram of the particular embodiment shown in FIG. 1.

Expitaxial growth of layers of semiconductor materials is well developed for GaAs and its ternary compounds. Thus, the growing of layers 20, 16 and 12 can be accomplished with known techniques. Due to the mismatch in band gap between layer 12 and 16 it is important to grow layer 12 on layer 16 so as to minimize the formation of any barrier between them. Theoretical analysis shows that with layer 16, as GaAs of a band gap of about 1.4eV and with layer 12 as a ternary compound of GaAs, such as AlGaAs, with a band gap of about 2.1eV there is no barrier in the valance band, designated by numeral 30 in FIG. 2. However, a spike or abrupt break may be present in the conduction band, as represented by numeral 31. This may be eliminated by growing layer 16 and gradually converting into the ternary compound of GaAs over a thickness of a few hundred Angstroms or so, and thereafter, continue to grow the layer 12 to possess the desired band gap width. This can be done by controlling the temperatures and gradually increasing the amount of the particular material, e.g., Al which is added to the GaAs.

It should be apparent that although hereinbefore the wide band gap layer 12 has been described for explanatory purposes, as AlGaAs, other compounds may be used. For example, $GaAs_{1-x}P_x$, which for example, has a band gap of 2eV when $x = 0.5$ may be used. Furthermore, semiconductor materials, other than GaAs and its ternary compounds, may be employed to form the wide band gap layer 12 and the narrower band gap layer 16, while insuring that no barrier is created between them. In selecting the compositions of the layers, the effect of the environment in which the cell is to operate should be considered. For example, the effect of humidity on Al should be considered if layer 12 is to incorporate Al to a very large value of x. As far as the thin metal film 14 is concerned it can be formed of different known metals. Gold, paladium and platinum are but three examples of metals which can be used to form this film 14 for the case of n type semiconducting layers 16 and 12.

Although particular embodiments of the invention have been described and illustrated herein, it is recognized that modifications and variations may readily occur to those skilled in the art and consequently, it is intended that the claims be interpreted to cover such modifications and equivalents.

What is claimed is:

1. A Schottky barrier solar cell comprising:
  a first layer of semiconductor material characterized by a first band gap width on the order of 1.4eV;
  a second layer of semiconductor material on top of said first layer and characterized by a second band gap width which is wider than the band gap of said first layer and is on the order of 2eV, the thickness of said second layer being on the order of not more than one micron;
  a third layer of semitransparent metal on top of said second layer and forming therewith a Schottky barrier, the thickness of said third layer being on the order of tens of angstroms, said third layer having a top surface remote from said second layer;
  a first electrical contact in electrical contact with said third layer at the top surface thereof, the top surface of said third layer, other than the surface portion covered by said first electrical contact, being exposable to solar radiation whereby at least some photons of energies greater than said second band gap are absorbed in said second layer, and photons of energies greater than said first band gap and less than said second band gap pass through said second layer and are absorbed in said first layer, with photons absorbed in both layers generating carriers which move to said barrier; and
  means including a second electrical contact, in contact with said first layer of semiconductor material.

2. The solar cell as described in claim 1 wherein said means comprise a semiconductor substrate for supporting said first, second and third layers therein and said second contact being in electrical contact with said substrate.

3. A Schottky barrier solar cell comprising:
  a substrate having a bottom side and a top side;
  a layer of semiconductor material deposited on the top side of said substrate, the layer being characterized by a bottom portion adjacent said substrate with an energy gap on the order of 1.4eV and a top portion remote from said bottom portion and extending to a top side of said layer with an energy gap on the order of 2eV, and an intermediate portion between said bottom and top portions in which the energy gap varies between the energy gaps of said bottom and top portions, the thickness of said tip portion being on the order of not more than one micron and the thickness of said intermediate portion being less than one micron;
  a layer of semitransparent metal on the order of tens of angstroms on top of the top portion of said layer of semiconductor material, said metal layer and said top portion of said semiconductor material forming a Schottky barrier; and
  first and second electrical contacts in contact with the bottom side of said substrate and said metal layer respectively.

4. The solar cell as described in claim 3 wherein the thickness of said intermediate portion is not more than one thousand angstroms.

5. The solar cell as described in claim 4 wherein the bottom portion of said semiconductor layer is GaAs and the top portion is a ternary compound of GaAs.

6. The solar cell as described in claim 1 wherein said second layer is a ternary compound of GaAs.

7. The solar cell as described in claim 6 wherein said means comprise a semiconductor substrate for supporting said first, second and third layers therein and said second contact being in electrical contact with said substrate.

8. The solar cell as described in claim 7 wherein said semiconductor substrate is doped GaAs.

* * * * *